Figure 1:
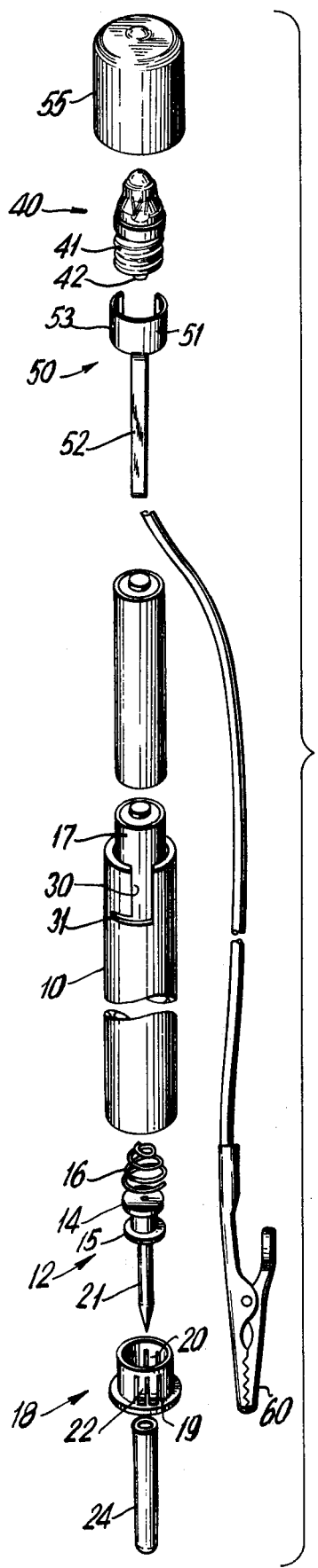

United States Patent [19]

Fortino

[11] 4,005,362
[45] Jan. 25, 1977

[54] ELECTRICAL CIRCUIT CONTINUITY TESTER

[76] Inventor: Samuel S. Fortino, 24 Lisa Drive, Dix Hills, N.Y. 11746

[22] Filed: Jan. 26, 1976

[21] Appl. No.: 652,544

[52] U.S. Cl. ............................ 324/51; 324/72.5
[51] Int. Cl.² .................. G01R 31/02; G01R 1/06
[58] Field of Search ............ 324/51, 53, 72.5, 149, 324/133; 339/108 TP

[56] References Cited

UNITED STATES PATENTS

| | | | |
|---|---|---|---|
| 1,386,474 | 8/1921 | Vince | 324/53 X |
| 2,413,484 | 12/1946 | Berger | 324/53 |
| 2,459,351 | 1/1949 | Weincord | 324/53 |
| 2,581,116 | 1/1952 | Lewis | 324/51 |
| 2,588,559 | 3/1952 | Needham | 324/53 |
| 2,666,894 | 1/1954 | Babernitsh | 324/53 |
| 3,227,948 | 1/1966 | Cheshire | 324/53 |

FOREIGN PATENTS OR APPLICATIONS 474,305  6/1961  Canada ........................... 324/53

Primary Examiner—Gerard R. Strecker
Attorney, Agent, or Firm—Hopgood, Calimafde, Kalil

[57] ABSTRACT

An electrical circuit continuity tester is described having a minimum number of components and including only a bulb, a cylindrical tube, batteries, a spring and 2 contacts which also serve as probes. One contact grips the bulb, affording mechanical and electrical contact between it and the battery while it simultaneously retains all the components in relative position. The other contact is needle shaped and is designed to minimize possible inadvertent shorts. For assurance against the continuity tester disassembling in storage or use, a simple bulb cover locks the bulb gripping contact, and hence the entire assembly, in position.

5 Claims, 2 Drawing Figures

U.S. Patent      Jan. 25, 1977      4,005,362

ELECTRICAL CIRCUIT CONTINUITY TESTER

BACKGROUND OF THE INVENTION

This invention relates generally to an electrical circuit continuity tester and in particular to a novel design having a minimum number of components.

Circuit continuity testers are in general as old and conventional as the basic circuits to which they are applied, but tend to be overcomplex for the function performed. Briefly, a continuity tester merely establishes whether or not circuit continuity exists between probe points. It does this by providing a lamp, and a source of potential in series with the test probes; the lamp lighting when continuity is established and failing to light when continuity is lacking.

Such testers generally employ batteries as the source of potential, and the series circuit generally includes a bulb, means for coupling to one terminal of the bulb, means for retaining the bulb in position, batteries, a spring for urging the batteries against the bulb electrode, means for coupling to the other battery terminal and a pair of probes. While the device is extremely simple in nature, it incorporates all too many components for its function. As a consequence components costs as well as the assembly costs are excessive.

Accordingly it is the object of this invention to provide an electrical circuit continuity tester with a minimum number of components.

It is a further object of this invention to provide an electrical circuit continuity tester which is simple and economical to assemble and produce.

It is still a further object of this invention to provide an electrical circuit continuity tester which provides maximum safeguards against inadvertent short circuiting and thereby prevents battery discharge during periods of nonuse.

The above mentioned and other features and objects of this invention and the manner of attaining them will become more apparent and the invention itself will best be understood by reference to the following description of embodiments of the invention taken in conjunction with the accompanying drawings, the description of which follows.

IN THE DRAWINGS

Herein FIG. 1 is an exploded view of the battery tester according to the invention.

Figure 2:
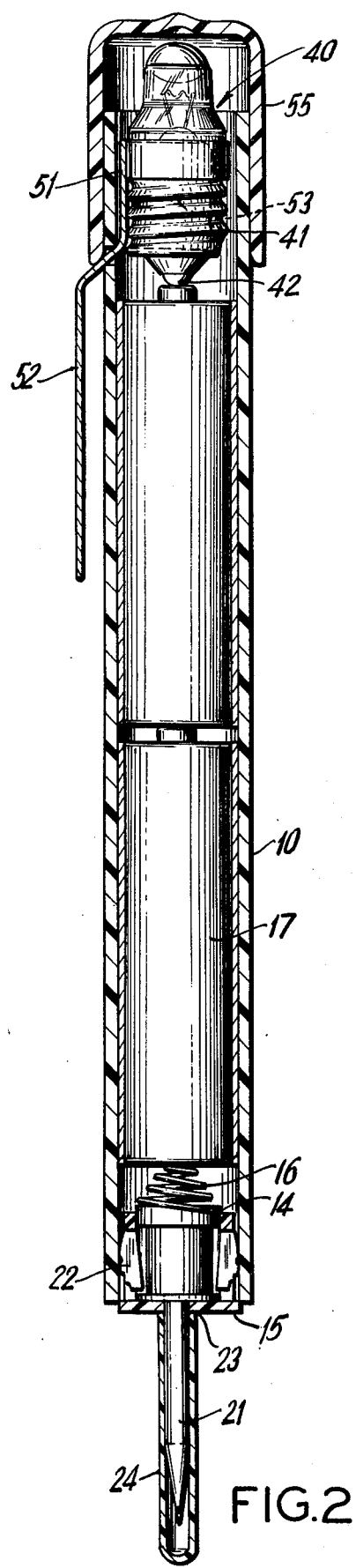

FIG. 2 is a cross-sectional view of the assembled components.

Turning now to the drawings, there is shown a cylindrical sleeve or tube 10 formed of insulating material. It is preferably of semirigid plastic so as to provide appropriate pressure relief or give when a cap is force fit into position at one end (as will be explained).

Probe 12 is centrally affixed at one end of the cylindrical tube 10. While this may be done by the simple expedient of piercing a closed end tube with the needle shaped probe, such has been found to have poor mechanical stability and tends to work loose during use. Accordingly, the preferred form is shown in the figures. Probe 12 is pin shaped having a flat top or contact 14, flange 15 and needle 21. The upper portion of top 14 provides contact to conical spring 16 and through the spring to the flat contact of battery 17.

Probe 12 is secured in position by a pressure fit insulating connector 18 and includes detents 19 and 20. Connector 18 slides over the needle 21 and flange 15, the detents snapping into position between the top 14 and flange 15 (contiguous the flange) leaving only the flat upper surface of the top uninsulated to meet the spring. End 22 of connector 18 is dimensioned (flanged) to be greater in diameter than the cylindrical tube's diameter thereby preventing total insertion of the connector into the cylindrical tube. The outer surfaces of the detents 19 and 20 are roughened to securely grasp the inside surface of the tube 10. As will be apparent to those skilled in the art, the needle probe or electrode is now precluded from relative movement with respect to the tube in either longitudinal direction.

The lower surface of end 22 of the connector completely covers the exposed end of the cylindrical tube; the needle end of the probe extending through an aperture 23 in the connector. A cover 24 is provided for the needle end 21 of the probe and when in use prohibits any contact with the probe assuring a life to the tester equivalent to the life of the batteries by preventing mishaps during storage or use. It bears mentioning that storage mishaps are frequent in the use of this type of a tester since it is generally thrown in a tool box and circuit continuity is established through various tools included in the box.

The other end of the cylindrical tube 10 includes a pair of communicating slits 30 and 31. Slit 30 is longitudinal in nature while slit 31 is circumferential. Bulb 40 is of the conventional form having a cylindrical electrode 41 and button electrode 42. Button electrode 42 mechanically and electrically connects to the button contact of the batteries in a conventional manner under pressure of the spring 16. The cylindrical electrode of the bulb 40 is embraced by a cylindrical electrode clip 50, the upper portion of which 51 is a split cylinder embracing at least 180° of bulb arc. Approximately 270° is preferable. It is formed of spring steel to tightly grasp the cylindrical electrode and includes a dimple 53 which enters the helix of the bulb 40 and avoids relative vertical movement between the two. Depending from the cylindrical portion 51 of the electrode clip is the second contact member or probe 52 which performs several functions. Probe 52 is dimensioned to longitudinally slide down slit 30 and then circumferentially rotate in slit 31 to lock both the bulb and second probe in position.

Finally to assure the components retain the position shown, a light diffusing cover member 55 is dimensioned to slide tightly over tube 10 reducing the width of slit 30 and preventing retrograde of the second probe, thereby locking the assembly. An alligator clip 60 (see FIG. 1) may be appended by wire (soldered) to the second probe to facilitate use.

As will be appreciated by those skilled in the art, the conventional necessity for a variety of components to both lock the bulb in position and afford the necessary electrical communication between the bulb and the associated probe is eliminated by the simple use of a clip formed to simultaneously perform all of the functional requisites described.

While the principles of the invention have been described in connection with specific apparatus, it is to be clearly understood that this description is made only by way of example and not as a limitation to the scope of the invention.

What is claimed is:

1. An electrical circuit continuity tester of the battery employing type comprising:

a cylindrical tube of insulating material dimensioned radially and longitudinally to receive at least one standard battery;

a needle contact mounted in and extending from one end of said cylindrical tube forming a first probe;

a longitudinal slit communicating with the other end of said cylindrical tube and running longitudinally therefrom for a predetermined distance, said slit including at the closed end thereof a circumferential communicating portion;

a bulb having cylindrical and button electrodes;

a cylindrical-electrode clip circumferentially embracing at least 180° of the bulb arc electrode and including integral therewith a second probe, dimensioned to protrude through said longitudinal slit portion sliding longitudinally thereof and through said circumferential slit portion rotating circumferentially thereof, locking said bulb in position;

a spring for normally urging bulb-battery-probe contact.

2. The electrical circuit continuity tester claimed in claim 1 further comprising a cup-shaped bulb cover, the cylindrical portion of said cover being dimensioned to compressively slide over the cylindrical tube end including said bulb reducing the dimensions of said longitudinal slit portion thereby preventing retrograde of said clip and locking said clip and bulb in position.

3. The electrical circuit continuity tester claimed in claim 2 wherein said needle contact is pin shaped including head and needle portions, the head portion being contained within the ends of said cylindrical tube;

a pressure fit insulating connector dimensioned to mechanically couple said head portion to cylindrical tube and having an aperture through which the needle end thereof protrudes.

4. The electrical circuit continuity tester claimed in claim 3 in which said pressure fit insulating connector includes a flange of greater dimension than the diameter of said cylindrical tube for preventing total insertion thereof.

5. The electrical circuit continuity tester claimed in claim 4 where the head of said pin shaped needle contact comprises two spaced flanges, one at the extreme end of said pin for providing a contact with a battery button, said pressure fit insulating connector including a pair of resilient detents for locking said connector on said head between said flanges;

said detents further including surface roughening for securely grasping the inside surface of said cylindrical tube.

* * * * *